(12) United States Patent
Scherr et al.

(10) Patent No.: US 9,504,143 B2
(45) Date of Patent: Nov. 22, 2016

(54) ELECTRICAL CIRCUIT

(71) Applicant: Infineon Technologies AG, Neubiberg (DE)

(72) Inventors: Wolfgang Scherr, Villach (AT); Volker Strutz, Tegernheim (DE)

(73) Assignee: Infineon Technologies AG, Neubiberg (DE)

( * ) Notice: Subject to any disclaimer, the term of this patent is extended or adjusted under 35 U.S.C. 154(b) by 338 days.

(21) Appl. No.: 13/869,570

(22) Filed: Apr. 24, 2013

(65) Prior Publication Data

US 2014/0320147 A1    Oct. 30, 2014

(51) Int. Cl.
| | |
|---|---|
| G01R 31/02 | (2006.01) |
| H05K 1/02 | (2006.01) |
| H05K 3/28 | (2006.01) |

(52) U.S. Cl.
CPC .......... *H05K 1/0268* (2013.01); *G01R 31/025* (2013.01); *H05K 1/0256* (2013.01); *H01L 2224/05553* (2013.01); *H01L 2224/48091* (2013.01); *H01L 2224/49171* (2013.01); *H01L 2224/73265* (2013.01); *H01L 2924/19107* (2013.01); *H05K 1/0263* (2013.01); *H05K 3/284* (2013.01); *H05K 2201/09063* (2013.01); *H05K 2201/10151* (2013.01)

(58) Field of Classification Search
CPC ... G01R 31/025; G01R 31/02; H05K 1/0256
USPC ............................. 438/14; 324/511
See application file for complete search history.

(56) References Cited

U.S. PATENT DOCUMENTS

| | | | | |
|---|---|---|---|---|
| 6,272,025 | B1 * | 8/2001 | Riggio et al. ................... 363/24 |
| 6,486,537 | B1 * | 11/2002 | Liebhard ............... H01L 21/568 |
| | | | | 257/666 |
| 7,442,583 | B2 * | 10/2008 | Bonaccio et al. ............ 438/130 |
| 7,786,567 | B2 * | 8/2010 | Wang .............................. 257/693 |
| 8,742,570 | B2 * | 6/2014 | Shenoy et al. ................. 257/724 |
| 2006/0267621 | A1 * | 11/2006 | Harris ................. G01R 31/2884 |
| | | | | 324/762.02 |
| 2009/0001554 | A1 * | 1/2009 | Otremba ........................ 257/708 |
| 2009/0102034 | A1 * | 4/2009 | Pagkaliwangan et al. ... 257/676 |
| 2009/0184406 | A1 * | 7/2009 | Lee ...................... H01L 23/4334 |
| | | | | 257/676 |
| 2009/0278244 | A1 * | 11/2009 | Dunne et al. .................. 257/676 |
| 2011/0086475 | A1 * | 4/2011 | Yamazaki et al. ............ 438/162 |
| 2012/0193736 | A1 * | 8/2012 | Mather et al. ................. 257/421 |
| 2014/0253139 | A1 * | 9/2014 | Lindsey .................. E01C 19/22 |
| | | | | 324/510 |
| 2015/0027513 | A1 * | 1/2015 | Ring et al. ..................... 136/249 |

* cited by examiner

*Primary Examiner* — Tung X Nguyen
*Assistant Examiner* — Feba Pothen
(74) *Attorney, Agent, or Firm* — Eschweiler & Associates, LLC

(57) ABSTRACT

An electrical circuit includes a first circuit part and a second circuit part. A first electrical potential is applicable to the first circuit part, wherein a second electrical potential is applicable to the second circuit part. The two circuit parts are galvanically isolated from each other by an insulator, wherein the insulator includes a conducting portion. This conducting portion can be safely sensed by an additional circuitry, to detect if a full or partial contact to the first electrical potential or the second electrical potential has occurred due to a voltage shift or a current flow on the conducting portion, which is itself insulated. This sensing circuitry can incorporate protection elements to clamp voltages and limit currents to prevent destruction of connected circuitries in case of a fail of the insulation.

27 Claims, 9 Drawing Sheets

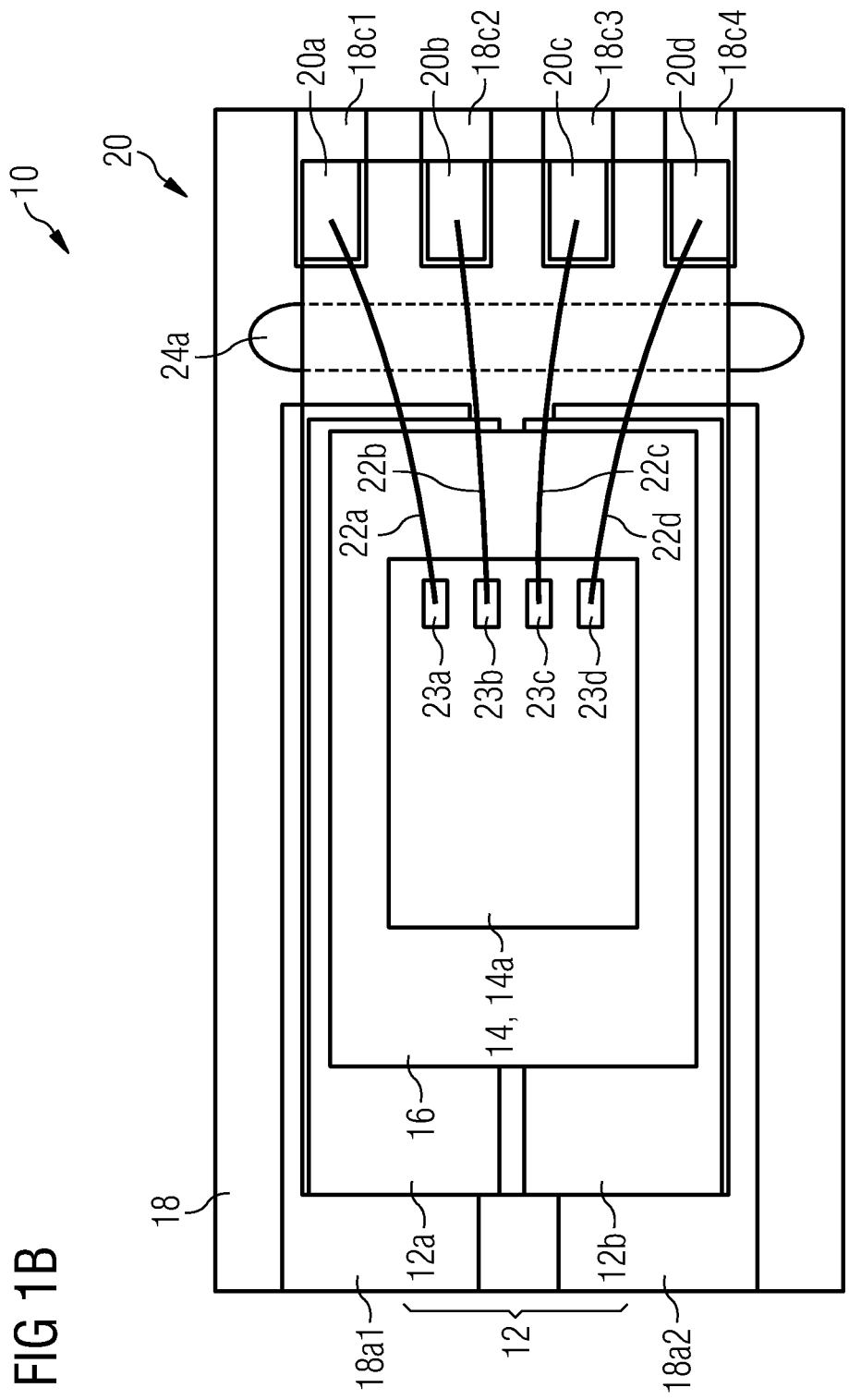

ELECTRICAL CIRCUIT

FIELD

Embodiments of the disclosure refer to an electrical circuit, a system comprising an electrical circuit and a controller and to a method for avoiding and detecting an electrical leakage.

BACKGROUND

In electronics, leakage may refer to an undesired loss of energy or to an undesired current flow. For example, a current of a high voltage section, e.g. power electronics or 400V battery pack of an EV (Electrical Vehicle), leaks out of the (high voltage) circuit part in an unintended way and flows into another circuit part which should be electrically isolated from the first circuit part, e.g. by a galvanic separation. The second circuit part may be a low voltage section (e.g. 12V, 5V, 3.3V or less) comprising a sensor, e.g. a current sensor for sensing the current flowing within the (high voltage) circuit part. Typically the low voltage circuit part includes the human interface, wherein the galvanic separation should ensure that any current cannot flow from the high voltage section to the low voltage section so that the low voltage section does not pose a danger to the user. Especially in case of EVs, the requirements regarding such galvanic separations are high. These requirements are specified in standard specification for functional safety, as given by actual standards like ISO 26262 (as relevant in the safety-critical automotive domain).

Designs fulfilling this standards will also require certain diagnostic capabilities to detect a possible dangerous breakthrough cases before these happen. This is required to warn the user in advance and allows an in-time maintenance cycle of critical or pre-damaged parts.

Currently, the requirements regarding the galvanic separation of the high voltage section and the low voltage section is achieved by increasing the isolation distance between the two sections, special diagnosis is omitted. However, beside a general trend to better diagnosed systems, there is a move towards reducing such isolation distances due to miniaturization and cost reduction. This may lead to an increased likelihood of electrical leakage due to effects like migration of electrons caused by delamination or moisture. Therefore, there is the need for an improved approach and by taking a possibility of diagnosis into account.

SUMMARY

An embodiment of the disclosure provides an electrical circuit comprising a first circuit part and a second circuit part which is galvanically isolated from the first circuit part by an insulator comprising a conducting portion. A first electrical potential is applicable to the first circuit part wherein a second (e.g. different) electrical potential is applicable to the second circuit part.

Another embodiment provides an electrical circuit comprising a common substrate or a common circuit board, a first circuit part, a second circuit part and a terminal. The first circuit part is arranged on the common substrate or on the common circuit board as a lower layer, wherein the second circuit part is arranged as an upper layer. The first circuit part and the second circuit part are galvanically isolated from each other by an insulator which is arranged between the first and second circuit part, wherein a first electrical potential is applicable to the first circuit part and wherein a second electrical potential is applicable to the second circuit part. The terminal is laterally arranged next to an area of the first and/or second circuit part and comprises one or more connecting taps. Furthermore, the second circuit part is electrically connected to the terminal via one or more bond wires, wherein the conducting portion is electrically connected to at least one conducting tap of the terminal via a further bond wire. Here, the first circuit part is a conductor part for a high voltage section, wherein the second circuit part is a circuit element (e.g. a sensor element) of a low voltage section.

A further embodiment provides a system comprising an above described electrical circuit and a controller which is coupled to the conducting portion and configured to disable the first circuit part in case of detecting the first and/or the second electrical potential present at the conducing portion.

A further embodiment refers to a method for avoiding an electrical leakage between a first circuit part and a second circuit part of an above described electrical circuit. The method comprises applying a first electrical potential to the first circuit part, applying a second electrical potential to the second circuit part and disabling the first circuit part in case of detecting the first and/or the second electrical potential present at the conducting portion.

BRIEF DESCRIPTION OF THE DRAWINGS

Embodiments of the present disclosure will subsequently be discussed referring to the enclosed figures.

FIG. 1b shows a schematic top view of the electrical circuit of FIG. 1a;

FIG. 3b shows a schematic top view of the electrical circuit of FIG. 3a;

DETAILED DESCRIPTION

Figure 1A:
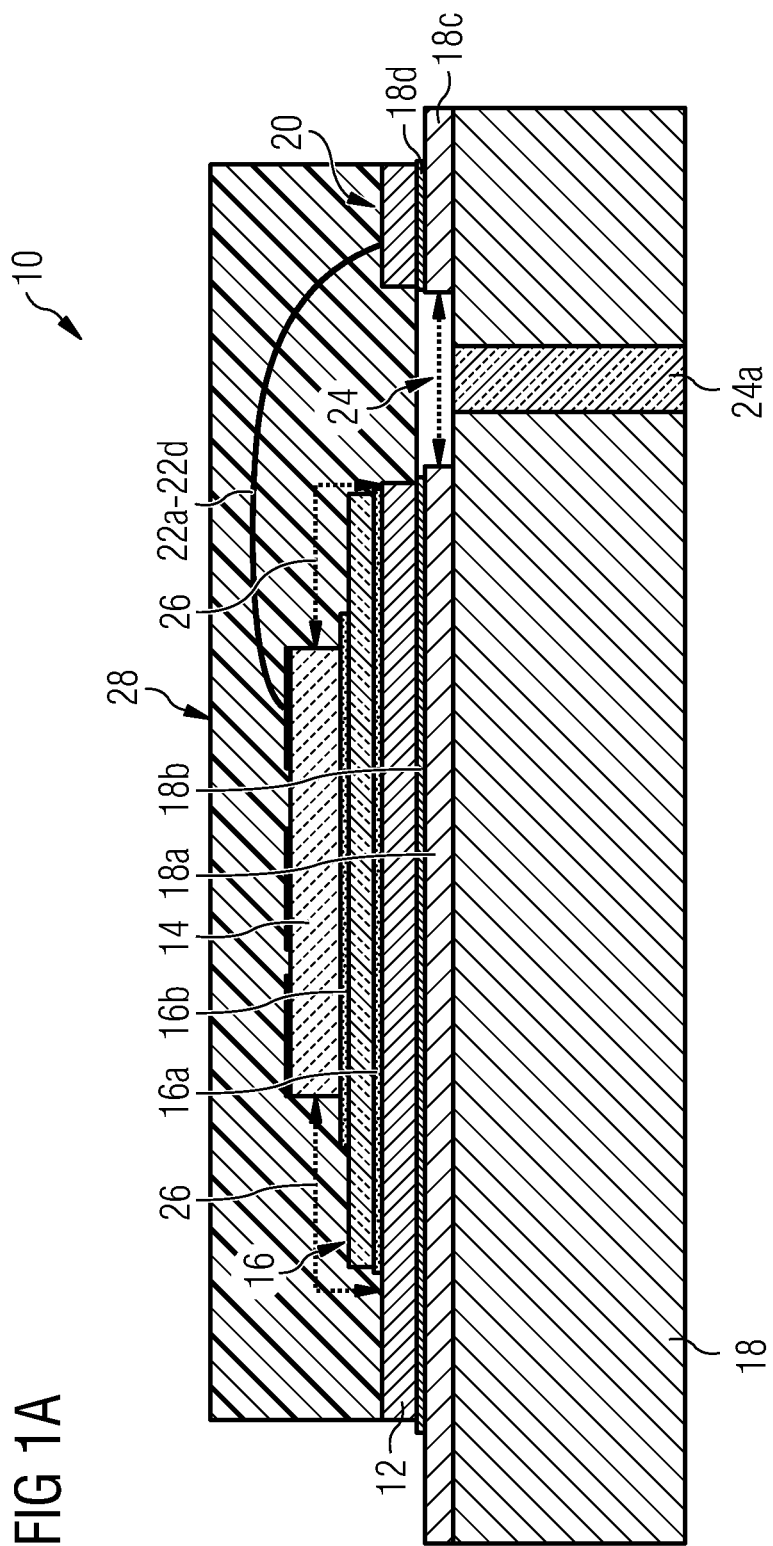
FIG. 1a shows a schematic cross sectional view of an electrical circuit comprising two circuit parts separated from each other according to the state of the art.

Different embodiments of the disclosure will subsequently be discussed referring to FIGS. 1a to 4d. In the drawings, identical reference numbers are provided to objects having identical or similar functions so that objects referred to by identical reference number within the different embodiments are interchangeable and the description thereof is mutually applicable.

FIG. 1a shows an electrical circuit 10 comprising a first circuit part 12, e.g. a conductor of a high voltage section (cf. EV), and a second circuit part 14, e.g. a sensor die or another low voltage circuit. The first and the second circuit parts 12 and 14 are arranged with an insulator 16 in between. In this example arrangement of the electrical circuit 10 the first circuit part 12 (also referred to as a leadframe) is formed as a lower layer, wherein the second circuit part 14 is formed as an upper layer so that the insulator 16 has the additional purpose to mechanically connect the two circuit parts 12 and 14. Therefore, the insulator 16 may optionally comprise an adhesive layer 16a at a first side for connecting the first circuit part 12 and/or an adhesive layer 16b at a second (opposite) side for connecting the second circuit element 14.

Before discussing the problems of electrical leakage by using the illustrated state of the art arrangement, optional elements of such an electrical circuit 10 will be discussed.

The electrical circuit 10 may be arranged at a substrate 18, for example, a PCB (Printed Circuit Board) with its lower layer 12. The substrate 18 may comprise a conductive layer 18a, for example, a cu-conductor or another conductor, at its surface which faces the circuit part 12 in order to electrically connect same. The circuit part 12 may be coupled to the conducting layer 18a via an intermediate layer 18b or via a plumb.

The second circuit part 14 may be electrically connected via an optional terminal 20 which is arranged laterally. The terminal 20 may comprise a plurality of connecting taps 20a, 20b, 20c and 20d (cf. FIG. 1b). Accordingly, the second circuit part 14 comprises further connecting taps 23a, 23b, 23c and 23d at its upper surface 14a (wherein the upper surface does not face the first circuit part 12), wherein a plurality of boding wires 22a, 22b, 22c and 22d are arranged between the connecting taps 23a, 23b, 23c and 23d and the connecting taps 20a, 20b, 20c and 20d for connecting the circuit part 14 to the terminal 20. The terminal 20 may also be attached to the substrate 18. Thus, the substrate 18 may comprise further conductive portions 18c1, 18c2, 18c3 and 18c4 (c.f. FIG. 1b), to which the terminal 20 or, in more detail, the connecting taps 20a, 20b, 20c and 20d are electrically connected by using a plumb 18d (or expressed in general terms, an intermediate layer). The conductive portions 18c (18c1-18c4) are isolated from the conductive portion 18a by an insulating area 24. Here, the insulating area 24 is formed by spacing between the portions 18a and 18c and/or by an insulating area 24a of the substrate 18. The insulating area 24a may also be formed by a spacing, i.e. that the substrate 18 comprises an opening 24a or a milled-out portion 24a.

According to a further implementation the chip 10 may comprise a housing 28. The housing 28 shelters the two circuit parts 12 and 14 together with the insulator 16 as well as the terminal 20. The housing 28 may be formed by a so-called mold-compound, i.e. that the electrical circuit 10 is molded by a non-conducting material, e.g. plastics.

Bellow, the functionality of the electrical circuit 10 will be described together with its drawbacks, starting from the basic implementation of the electrical circuit 10 comprising the two layers 12 and 14 as well as the insulator 16. As illustrated by FIG. 1a the second circuit part 14 (upper layer) has a reduced lateral expansion when compared to the first circuit part 12 (lower layer) as well when compared to the insulator 16 in between, i.e. that the three layers are arranged like a pyramid in order to provide a proper galvanic isolation between the two layers 12 and 14 (cf. arrows marked by the reference numerals 26). The two layers 12 and 14 are galvanically isolated, i.e. that the two layers 12 and 14 are coupled to each other so that an energy or an information can be exchanged, wherein a current flow between the two layers 12 and 14 is prevented by the insulator 16. The implementation of such a galvanic isolation 26 may be based on induction or magnetic flux (cf. transformer).

Many applications are based on such galvanic isolations 26, e.g. a current sensor 10 for sensing the current flowing through the first circuit part 12 by using the sensor die 14. As discussed above, the second circuit part 14 is typically implemented as a low voltage circuit, wherein the first circuit part 12 is part of a high voltage section. Thus, the insulator 16 is a safety critical part. In order to enable further miniaturization of the electrical circuit 10 or in order to meet requirements, for example the ASIL/ISO 26262, the insulator 16 has to be improved, as shown with regard to FIG. 2.

Figure 2:
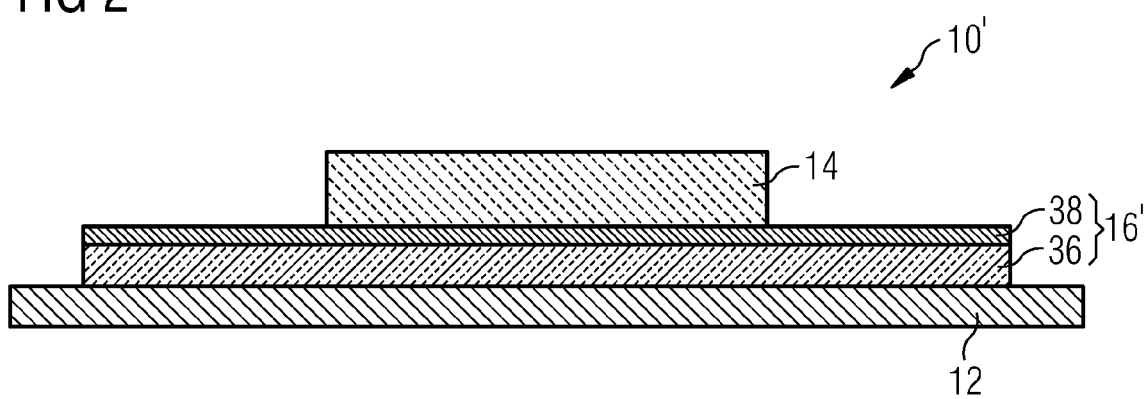
FIG. 2 shows a schematic electrical circuit comprising two circuit parts separated by an improved isolator according to an embodiment.

FIG. 2 illustrates an improved approach of the insulation 16, wherein it should be noted that the shown electrical circuit 10' of FIG. 2 just shows the basic arrangement for illustrating the principle of the improved insulation 16'.

FIG. 2 shows an electrical circuit 10' comprising the first circuit part 12 and the second circuit part 14 which may be arranged as parallel layers. Between the two circuit parts 12 and 14 the improved insulator 16' is arranged in order to provide a galvanic insulation between the two circuit parts 12 and 14. The insulator 16' comprises an insulating portion 36, e.g. an oxide or plastics, and a conducting portion 38. The conducting portion 38 may be arranged between the insulator 36 and the second circuit part 14, wherein variations may be possible as will be explained below. Here, the conducting portion 38 is formed by an area (layer) which extends in parallel to the two circuit parts 12 and 14.

The below discussion is made on the assumption that the two circuit parts 12 and 14 may have a different electrical potential, so the circuit part 12 may have a high voltage potential (e.g. 400V), wherein the second circuit part 14 may be on the supply potential of the chip 10' (e.g. 15V) or on the ground potential of the chip 10' (e.g. 0V) dependent on the used technology. The conducting portion 38 has the purpose to collect a current flowing from the first circuit part 12 in case of a failing insulator 36. Here, two effects are achieved: The first effect is that the current of the first circuit part 12 may be discharged via the conducting portion 38 to a certain electrical potential before it jumps over to the second circuit part 14. A second effect is that the known electrical potential of the conducting portion 38, e.g. the electrical potential of the substrate, is changed in case of a failing insulator 36. This enables that the leakage or the fault current resulting from an insulation breakdown of the first circuit 12 is detectable so that the respective circuit part 12, which is not properly isolated, can be disabled in order to avoid an undesired current flow between 12 and 14.

Figure 3A:
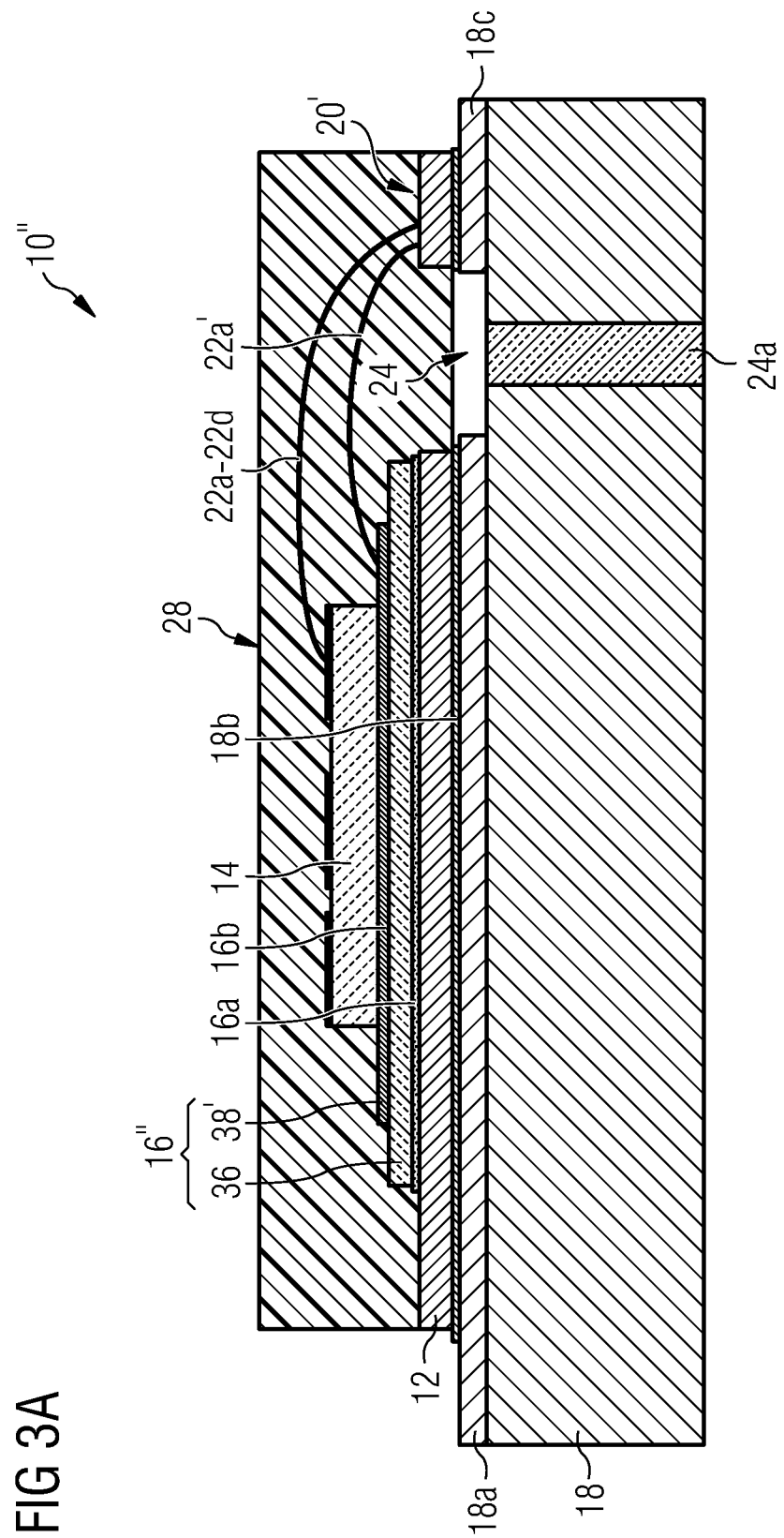
FIG. 3a shows a schematic cross sectional view of an electrical circuit comprising two circuit parts separated by an isolator comprising a ring-shape conducting portion according to an embodiment.
Figure 3B:
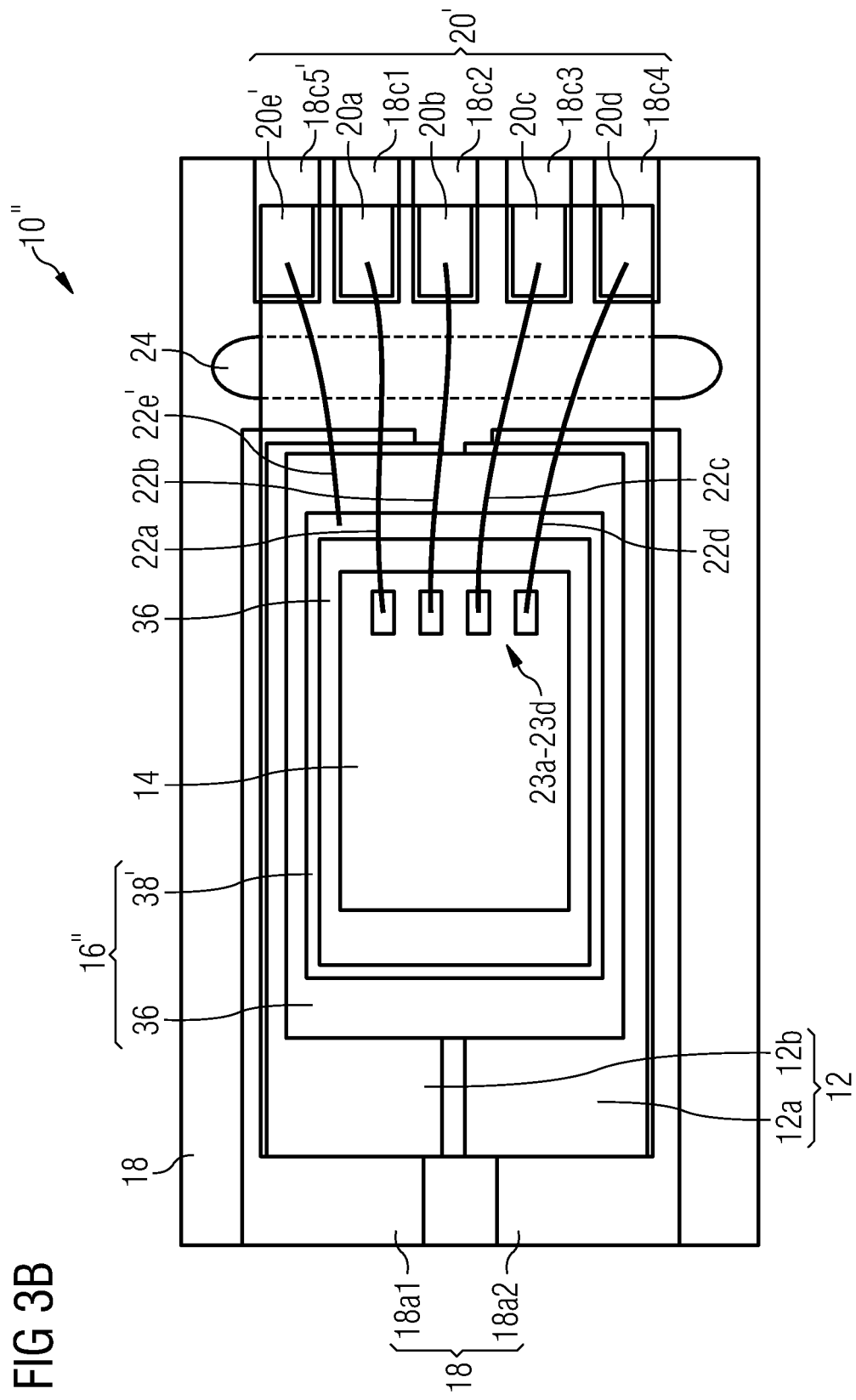

Referring to FIGS. 3a and 3b as well as to FIGS. 3c and 3d, implementations of the above described disclosure will be discussed together with optional aspects.

FIGS. 3a and 3b show an electrical circuit 10", which is substantially equal to the electrical circuit 10 of FIGS. 1a and 1b. Consequently, the electrical circuit 10" comprises the two circuit parts 12 and 14, which are arranged on the substrate 18. In contrast to FIG. 1a, the two circuit parts 12 and 14 are isolated by an insulator 16" comprising the insulating portion 36 and the conducting portion 38'. As illustrated by FIG. 3b, the conducting portion 38' has a ring-shape laterally surrounding the area of the second circuit part 14, i.e. that the second circuit part 14 is attached to the insulator 36 directly or via an optional adhesive layer 16b (cf. FIG. 1a). Consequently the inner diameter of the conducting portion 38' is larger than the circuit part 14, wherein the outer diameter is smaller than the area of the circuit part 12. Therefore, the circuit part 14 may be arranged at the same layer of the conducting portion 38'.

In the shown implementation of the electrical circuit 10", the conducting portion 38' is electrically isolated from the first circuit part 12 as well as from the second circuit part 14 due to its shape. This enables one to detect (and to discharge) a fault current from the first circuit part 12 and from the second circuit part 14, wherein the basic functionality corresponds to the functionality discussed in context of FIG. 2.

According to the circuit 10 shown in FIGS. 3a and 3b, the electrical circuit 10" may comprise a terminal 20' having a plurality of pins 20a, 20b, 20c and 20d for electrically connecting the second circuit part 14 (pins 23a-23d) via the plurality of bonding wires 22a to 22d. Furthermore, the terminal 20' comprises an additional pin 20e' for electrically connecting the conducting portion 38' (also referred to as sensing element 38") via an additional bonding wire 22e' in order to detect the electrical potential of the conducting portion 38' from external. The connecting tap 20e' is electrically connected to an optional conductive portion 18c5' of the substrate 18. It should be noted that the connecting tap 20a' lying adjacent to the connecting tap 20e' for the sensing element 38' is, in one embodiment, the pin for connecting the circuit element 14 to the potential of the substrate 18.

Below, another implementation will be discussed in which the conducting portion 38" has the shape of an area. FIGS. 3c and 3d show an electrical circuit 10''' comprising the circuit parts 12 and 14 as well as an insulator 16''' having the area-shape conducting portion 38". The conducting portion 38" is arranged between the insulator 36 and the second circuit part 14, wherein the second circuit part 14 is arranged on the conducting portion 38" via an adhesive layer 16b. The adhesive layer 16b may, in one embodiment, comprise a non-conductive material, e.g. a non-conductive glue, such that the conductive portion 38" is isolated from the second circuit part 14. Thus, a failing of the insulator 36 as well as a failing of the adhesive (insulating) layer 16b is detectable via a signal, e.g. a voltage change, output via the bonding wire 22e' and the connecting tap 20e' (also referred to as a sensing pin).

Below, different implementations of a control unit which enables the detection of an insulation breakdown (leakage) by using the conducting portion 38, 38' or 38" will be discussed.

Figure 4A:
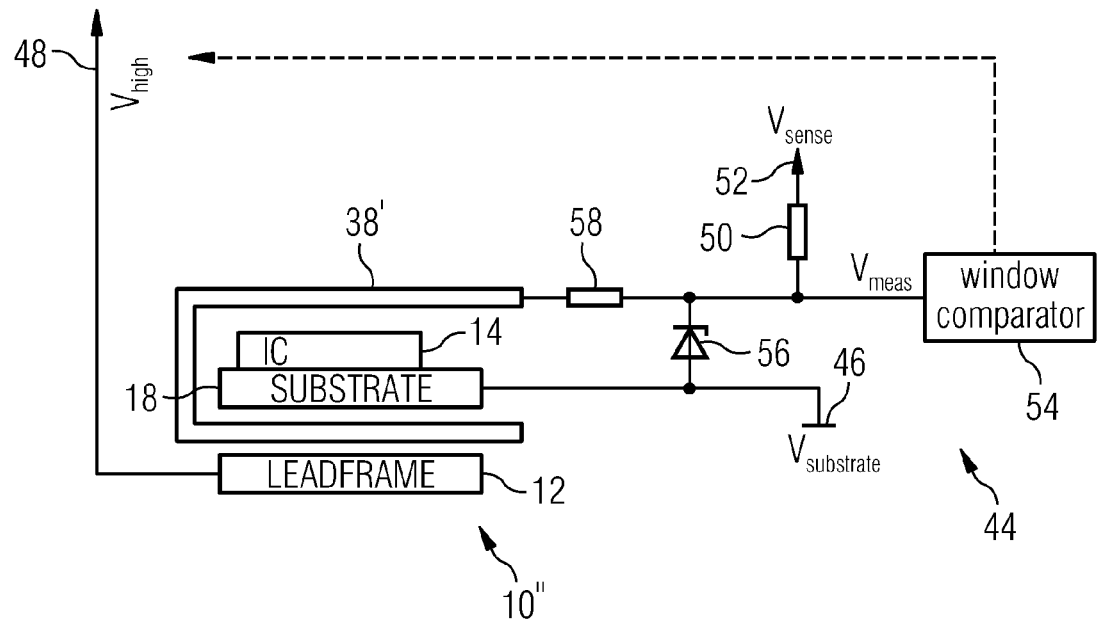
FIGS. 4a and 4b show schematic block diagrams of electrical circuits together with a controller for disabling a circuit part according to an embodiment.

FIG. 4a shows a control unit 44 for an electrical circuit 10" as shown in FIGS. 3a and 3b. Here, the second circuit part 14 is on the potential of the substrate $V_{substrate}$, for example ground 46. The circuit part 12 is on a high voltage potential $V_{high}$ (marked by the reference numeral 48). Between the two circuit parts 12 and 14 the conducting portion or sensing element 38' is arranged insulated from 12 and 14. Here, the schematically shown conducting portion 38' has a U-shape for illustrating that same is insulated from second circuit part 14 due to its shape (cf. FIGS. 3a and 3b).

The conducting portion 38' has a known electrical potential $V_{meas}$ (typically: $V_{meas} < V_{high}$) which can be measured by using the control unit 44. A change of the electrical potential $V_{meas}$ or in general a value for $V_{meas}$ out of a predetermined range (e.g. $V_{meas} = V_{high}$) indicates an insulation breakdown. Therefore, the conducting portion 38' is coupled to the control unit 44, which is configured to disable the circuit comprising the first circuit part 12 in case of detecting the first and/or the second electrical potential present and the conducting portion 38', i.e. in case of an insulation breakdown. In detail, the controller 44 may output a disable signal (cf. arrow having the broken lines) in order to switch off the high voltage 48 $V_{high}$ to a switch unit (not shown), like a relays, of the respective circuit.

In this implementation the control unit 44 comprises a signal detection element 54, e.g. a window comparator, and an electrical element 50, e.g. a limiter element, like a resistor, or a capacitor which is coupled with its first side to the conducting portion 38a and with its second side to a known potential $V_{sense}$ (cf. reference numeral 52). The electrical element 50 has the purpose to perform a resistance measurement over same in case of using a resistor as electrical element 50 or an impedance measurement over same in case of using a capacitor as electrical element 50. The measurement is performed by the signal detection element 54 which is connected to the conducting portion 38' and thus to the first side of the electrical element 50. The detection element 54 is configured to detect a signal, for example a voltage, out of a predetermined range $V_{sense} - V_\epsilon < V_{meas} < V_{sense} + V_\epsilon$, wherein $V_\epsilon$ is the useful error limit given by inaccuracy of window comparator measurement and drifts, or a voltage change $\Delta V_{meas}$ (indicating a presence of the first or the second electrical potential at the conductive portion 38'). To summarize, the control unit 44 outputs the disable signal if the above described condition regarding the signal range of $V_{sense}$ is false.

According to further embodiments the control unit 44 may comprise a clamping element 56. Here, the clamping element 56 is formed by a zener-diode which is arranged in a forward direction referenced to ground 46. The clamping element 56 is arranged between the conducting portion 38' (at the measurement input of the controller 44) and the substrate 18 or ground 46. This clamping element 56 has the purpose to conduct the (overshot) current to ground 46 just in case of an insulation breakdown.

According to a further embodiment a protection element 58, e.g. a resistor or a high resistance resistor having a resistance of more than 10K ohm or even more than 1000K ohm, may be arranged between the controller 44 and the conducting portion 38'. The high resistance resistor 58 has the purpose of avoiding the damage of the controller 44 in case of insulation breakdown and to provide a fail-safe mode. In other words that means that the sensing circuitry 44 can incorporate protection elements 58 to clamp voltages and limit currents to prevent destruction of connected circuitries in case of a fail of the insulation.

Figure 3C:
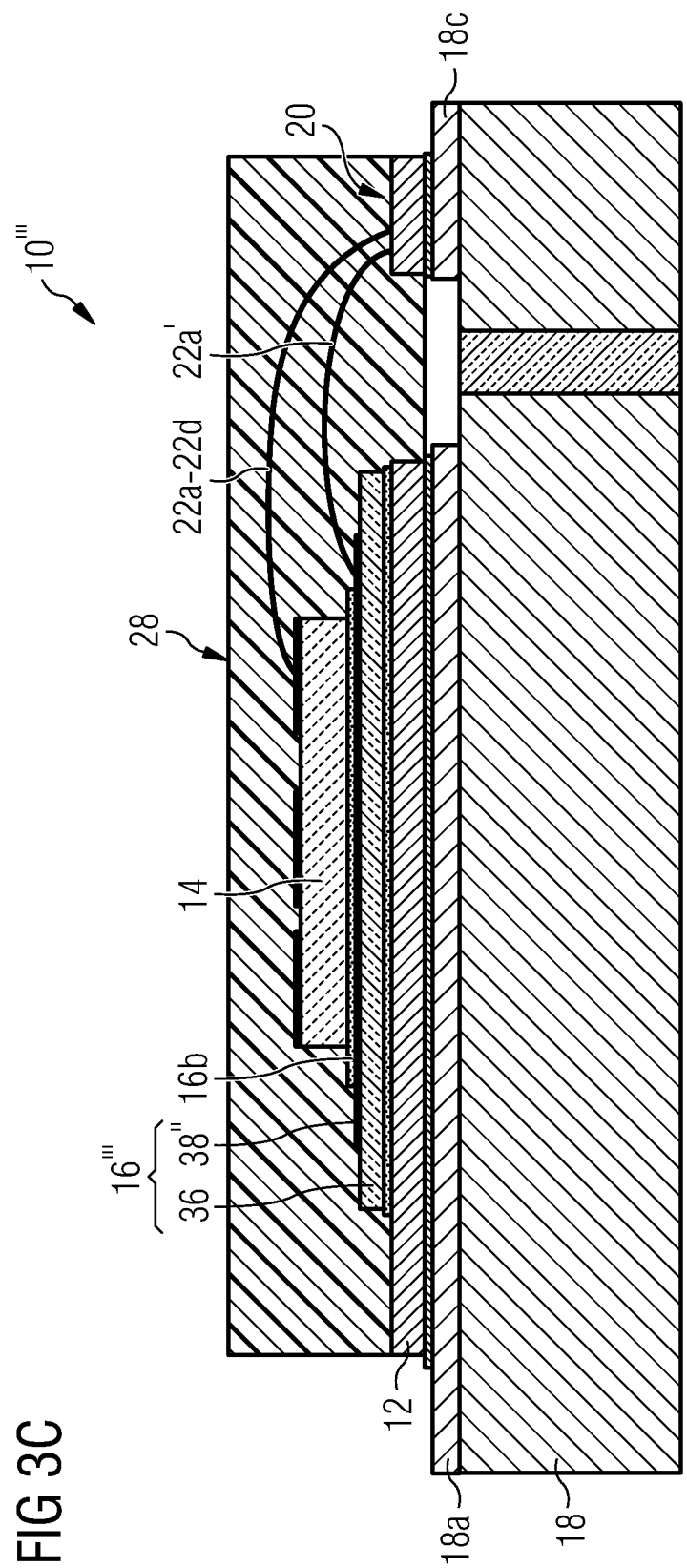
FIG. 3c shows a schematic cross sectional view of an electrical circuit comprising two circuit parts separated by an insulator comprising an area-shape conducting portion according to another embodiment.
Figure 3D:
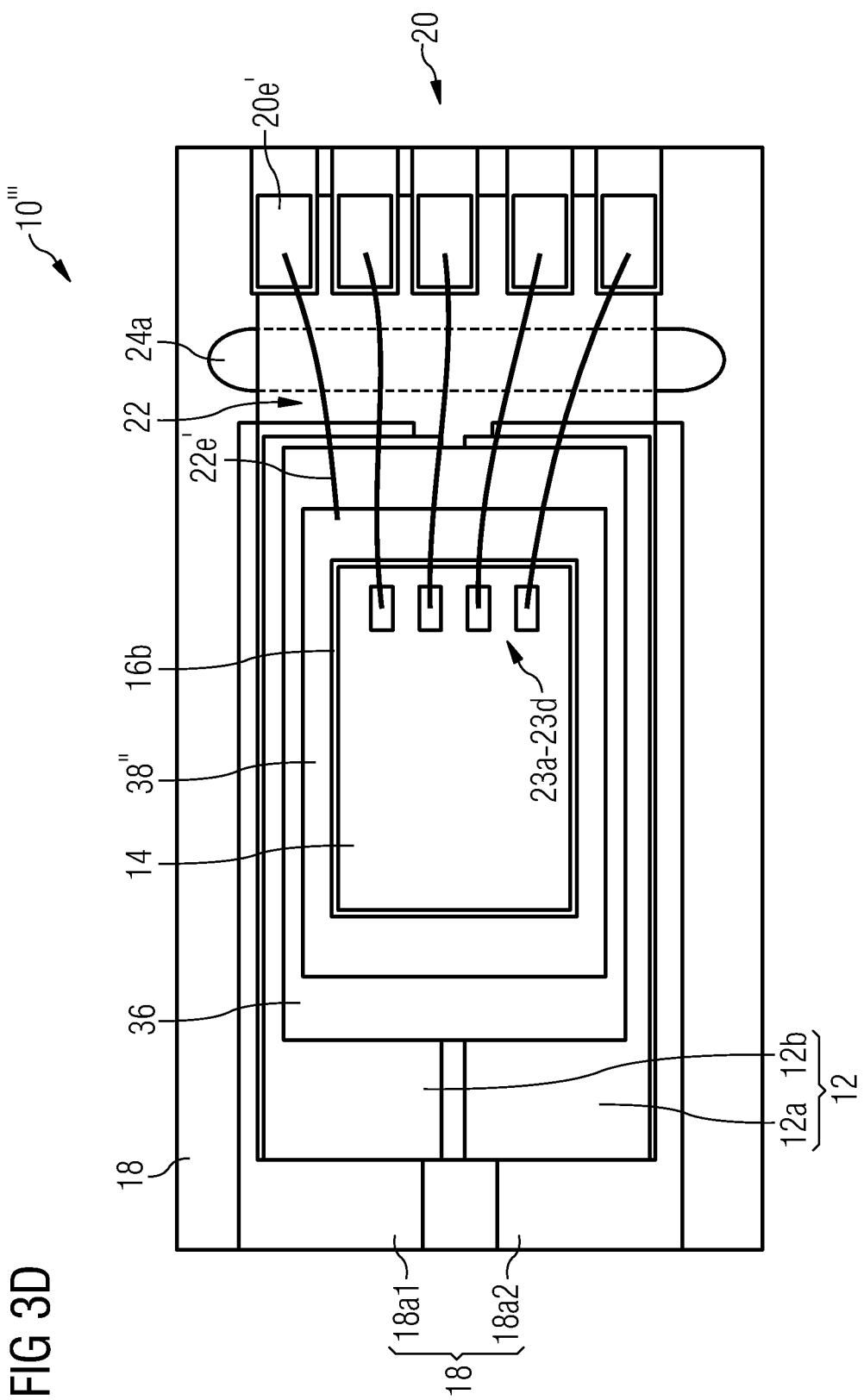
FIG. 3d shows a schematic top view of the electrical circuit of FIG. 3c.
Figure 4B:
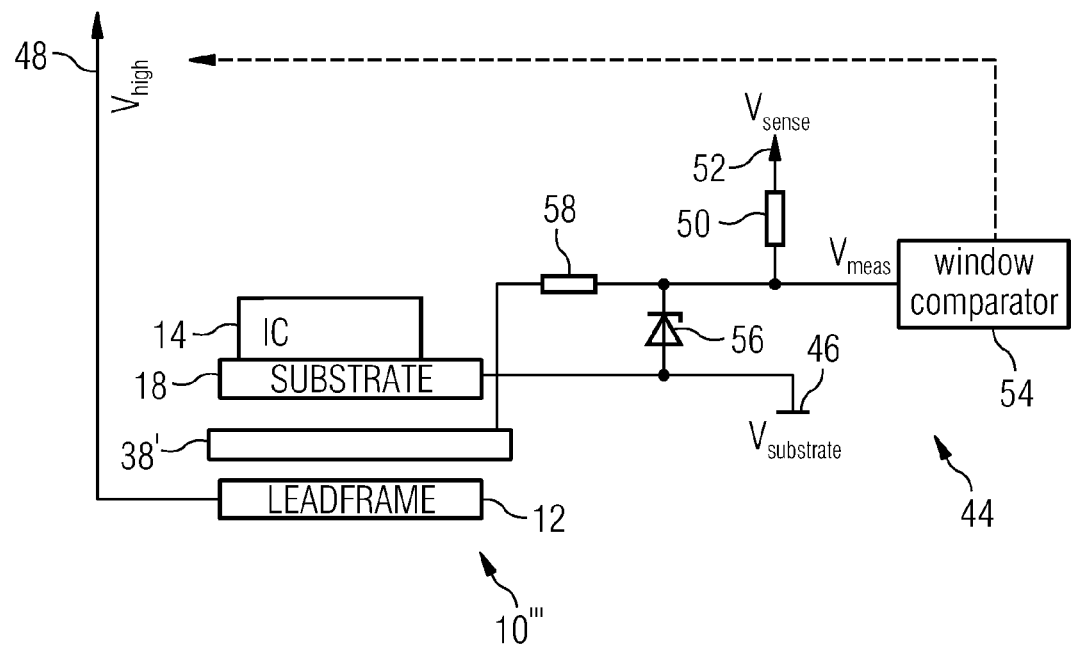

FIG. 4b illustrates another system comprising the electrical circuit 10''' shown in FIGS. 3c and 3d and the control unit 44. The difference between the two implementations of FIGS. 4a and 4b is the different conducting element 38' of the electrical circuit 10'''. Here, the conducting element 38' is embedded into the insulator (not shown) and thus is insulated from the first and second circuit part 12 and 14 in accordance with the embodiment of FIG. 4a, so the functionality and the structure of the control unit 44 is similar.

Figure 4C:
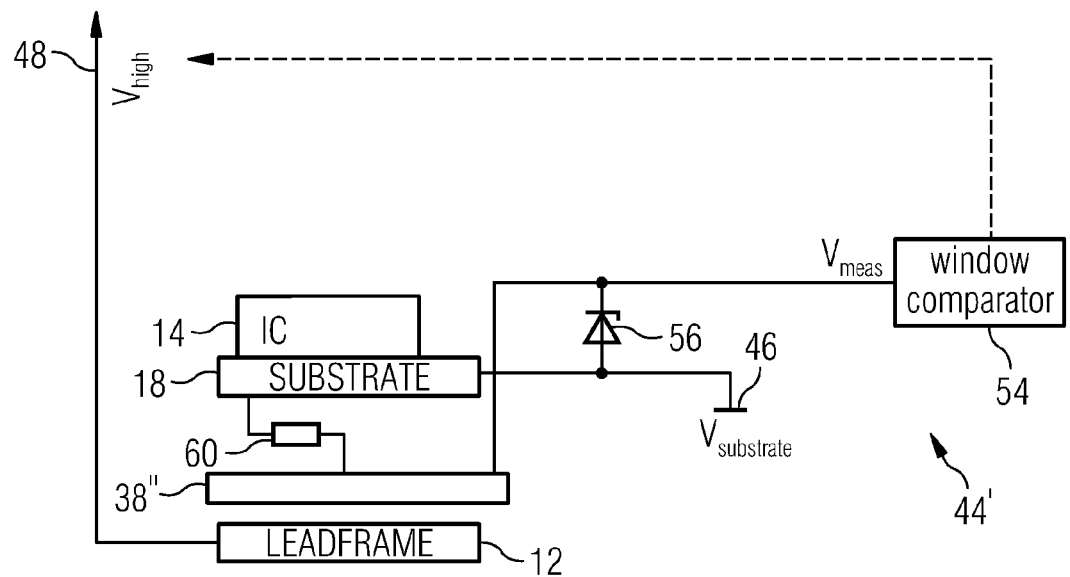
FIG. 4c shows a schematic block diagram of another electric circuit together with a further controller for disabling a circuit part according to an embodiment.

FIG. 4c illustrates another implementation of a control unit 44' for an electrical circuit 10''' shown in FIGS. 3c and 3d, wherein the adhesive layer 16b is made by a conductive material. Thus, the conductive portion 38''' is arranged insulated from the first circuit part 12 and resistor-like coupled to the second circuit part 14. The conductive behavior of the adhesive layer 16b is illustrated by a further resistor 60 arranged between the substrate 18 and the second circuit 14. As illustrated by FIG. 4c, the substrate 18 is coupled to ground 46 or to another potential $V_{substrate}$.

In this embodiment the control unit 44' comprises the signal detection element 54 which is configured to detect a change of the signal or the voltage $V_{meas}$. Here, the signal is directly detectable (i.e. without any electrical element-like resistor) because of the resistor-like behavior of the adhesive layer (cf. resistor 60). This means that the resistor 60 is used as an electrical element (cf. FIG. 4b, resistor 50), wherein $V_{substrate}$ is used as $V_{sense}$. It should be noted that the control unit 44' of this implementation is configured to detect just the presence of the electrical potential $V_{high}$ present at the conductive element 38".

As described above, the control unit 44' may comprise the optional clamping element 56 which may be integrated into the chip or implemented as a separate die.

Figure 4D:
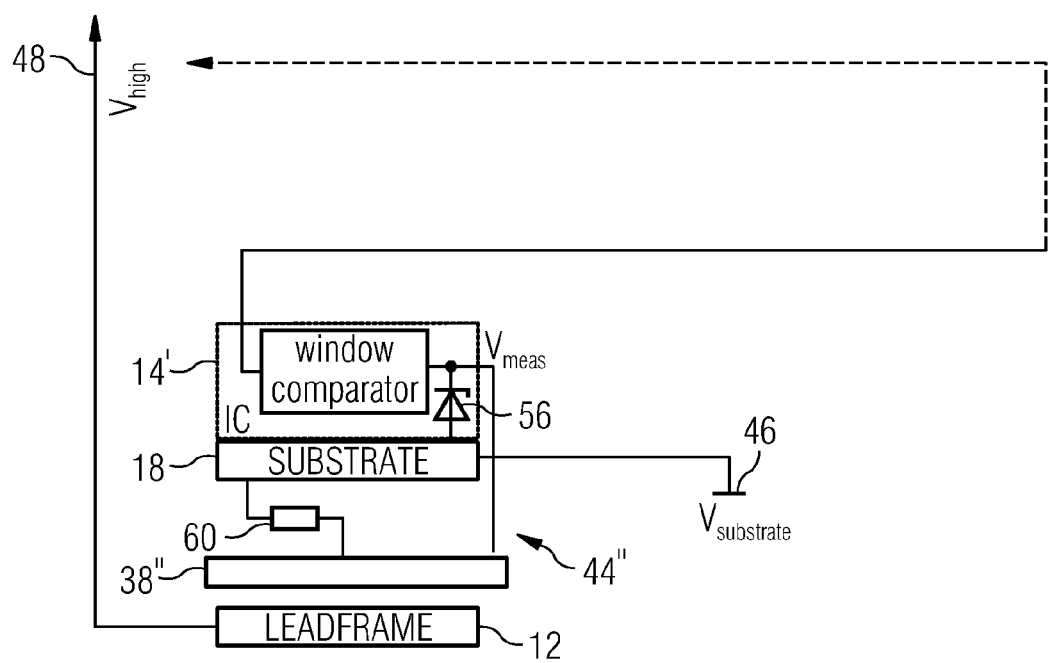
FIG. 4d shows a schematic block diagram of the electrical circuit of FIG. 4b together with an integrated controller according to an embodiment.

With regard to FIG. 4d, another implementation of the control unit 44" will be discussed which is substantially equal to the control unit 44' of FIG. 4c, but in contrast is integrated into the second circuit 14'. Expressed in other words, this means that the second circuit 14' is configured to output a signal signaling an insulation leakage. As illustrated, the second circuit 14' may also comprise the optional clamping element 56.

According to a further embodiment the controller 44, 44' and 44" may comprise means for disabling the first circuit part 12. This means may be implemented as a microprocessor.

Referring to FIGS. 3a to 3d it should be noted that the shown implementations of the electrical circuit 10" and 10"' may also be integrated into the housing 28. Furthermore, the layer arrangements of the electrical circuits 10" and 10"' may vary in such a way that adhesive layers 16a and 16b as well as 18b may be present.

Additionally, it should be noted that the shown principle of integrating a conductive portion as a sensor element into an insulator may also be applied to different applications, e.g. to further power products. As a consequence that means that the layer arrangement may differ. Thus, the above described aspects of the present disclosure are not limited to the shown layer arrangements. According to a further embodiment the two insulated circuit parts may be laterally arranged, wherein the insulator having the conductive portion is arranged in between.

According to further embodiments a chip may comprise a plurality of the above described insulators having the conductive portion embedded, wherein the plurality of such insulators may be arranged at laterally distinct areas of the chip or within one layer stack. Here, it should be noted that one control unit suffices for the plurality of insulators to be monitored.

Referring to FIGS. 3b and 3d, it should be noted that the shown first circuit part 12 may comprise a plurality of circuit elements 12a and 12b which form the circuit part 12. Accordingly, the conductive portion 18a of the substrate 18 may also have a plurality of separated conductive portions 18a1 and 18a2.

Referring to the embodiments of FIGS. 3a to 3d it should be noted that the sensor pin 20e' is merely used for testing during the production, for example for characterizing the insulation properties.

With respect to FIGS. 4a and 4c, it should be noted that further embodiments relate to a system comprising one of the above discussed electrical circuits 10', 10" or 10"' and one of the above described control units 44, 44' or 44".

Although some aspects have been described in the context of an apparatus, it is clear that these aspects also represent a description of the corresponding method for avoiding an electrical leakage or for detecting an insolation breakdown between a first circuit part 12 and a second circuit part 14. The method comprises applying a first electrical potential to the first circuit part 12, applying a second electrical potential to the second circuit part 14 and disabling the first circuit part 12 in case of detecting the first and/or the second electrical potential present at the conducting portion 38, 38' or 38". According to further embodiments, the second circuit part 14 may be disabled in case of detecting one of the electrical potentials present at the conductive portions 38, 38' or 38". Aspects described in the context of a method step also represent a description of a corresponding block or item or feature of a corresponding apparatus. Some or all of the method steps may be executed by (or using) a hardware apparatus, like for example a microprocessor, a programmable computer or an electronic circuit. In some embodiments, some one or more of the most important method steps may be executed by such an apparatus.

The electrical schematics as given by FIGS. 4a, 4b, 4c and 4d shall describe the general principle of leakage detection on this sensor element placed between the two voltage domain. It can be assumed that other general circuits for leakage detection and clamping structures are used, providing the same functionality. Referring to FIG. 4a for example, instead of using a resistor element 50, clamping element 56, limiter element 58 and window comparator 54 another implementation could be used. Instead of element 50, an active current source can be used which tries to draw a current from the sensing element 38', the limiting element 58 may be integrated in the current source as well. As long as the sensing element 38' has no connection, this current source will be in saturation, which means it cannot push or pull any current. It stays at a certain voltage level, which is usually given by the detailed design of this block. A leakage path can now be detected by the current source, as it will start to leave the saturated state (changing the voltage as referred to by Vmeas) as soon as a current flow is possible via 38'. Furthermore, the active current source may provide an internal regulation signal directly stating the change of the output current. This has the advantage that a second current source in parallel may be used to diagnose the functionality of this system. This diagnosis would introduce a current on purpose, to check if the changing level on Vmeas or in general a current flow change in the first current source can be detected. To sum up, that means that the conducting portion 38, 38' or 38" can be safely sensed by an additional circuitry 44 to detect if a full or partial contact to the first electrical potential or the second electrical potential has occurred due to a voltage shift or a current flow on the conducting portion, which may be itself insulated.

The above described embodiments are merely illustrative for the principle of the present disclosure. It is understood that modifications and variations of the arrangements and the details described herein will be apparent to others skilled in the art. It is therefore the intent to be limited only by the scope of the appended patent claims and not by the specific details present by way of description and explanation of the embodiments herein.

The invention claimed is:

1. An electrical circuit, comprising:
    a first substantially planar electrical circuit part to which a first electrical potential is applicable; and
    a second substantially planar electrical circuit part to which a second, different electrical potential is applicable and which is galvanically isolated from the first substantially planar electrical circuit part by an insulator;
    wherein the insulator comprises a conducting portion;
    wherein the first and the second substantially planar electrical circuit parts and the insulator form a layer stack, in which the insulator is arranged between the first and the second substantially planar electrical circuit part, and at least a portion of the second substantially planar electrical circuit part overlies the first substantially planar electrical circuit part;

wherein the first substantially planar electrical circuit part is a conductor of a high voltage section; and wherein the second substantially planar electrical circuit part is a circuit element of a low voltage section.

2. The electrical circuit according to claim 1, wherein the conducting portion is formed by a conductive ring surrounding the second substantially planar electrical circuit part.

3. The electrical circuit according to claim 1, wherein the conducting portion is formed by a conductive area arranged between the first and the second substantially planar electrical circuit parts.

4. The electrical circuit according to claim 1, wherein the insulator is arranged between the first substantially planar electrical circuit part and the conducting portion.

5. The electrical circuit according to claim 1, wherein the conducting portion is embedded into the insulator.

6. The electrical circuit according to claim 1, wherein the second substantially planar electrical circuit part comprises a sensor element which is configured to detect a signal present at the first substantially planar electrical circuit part.

7. The electrical circuit according to claim 1, wherein the first and the second substantially planar electrical circuit parts comprise a common substrate or are attached to a common circuit board.

8. The electrical circuit according to claim 1, wherein the first substantially planar electrical circuit part is arranged at a lower layer and wherein the second substantially planar electrical circuit part is arranged at an upper layer.

9. The electrical circuit according to claim 1, wherein the electrical circuit comprises a single terminal comprising one or more connecting taps which is laterally arranged next to and spaced apart from the first and/or second substantially planar electrical circuit parts.

10. The electrical circuit according to claim 7, wherein the common substrate or the common circuit board of the electrical circuit comprises a terminal comprising one or more connecting taps, wherein an insulating area is arranged between the terminal and an area of the first and/or the second substantially planar electrical circuit part.

11. The electrical circuit according to claim 9, wherein the second substantially planar electrical circuit part is electrically connected to one or more connecting taps of the terminal via one or more bond wires.

12. The electrical circuit according to claim 9, wherein the conducting portion is electrically connected to at least one connecting tap of the terminal via a further bond wire or via another conducting element.

13. The electrical circuit according to claim 1, wherein the conducting portion is coupled to a controller which is configured to disable the first substantially planar electrical circuit part in case of detecting the first and/or the second electrical potential present at the conducting portion.

14. The electrical circuit according to claim 13, wherein the controller comprises an electrical element and a signal detection element configured to detect a signal applied to the conducting portion, the signal indicating the presence of the first and/or the second electrical potential.

15. The electrical circuit according to claim 14, wherein the electrical element comprises a resistor or current source, which is coupled to the conducting portion at a first side and to another electrical potential at a second side, and wherein the signal detection element is configured to detect a voltage change at the resistor, the voltage change indicating the presence of the first and/or the second electrical potential.

16. The electrical circuit according to claim 14, wherein the electrical element comprises a capacitor which is coupled to the conducting portion at a first side and to another electrical potential at a second side, and wherein the signal detection element is configured to detect an impedance change at the capacitor, the impedance change indicating the presence of the first and/or the second electrical potential.

17. The electrical circuit according to claim 13, wherein the controller is coupled to the conducting portion via a protection element or via a resistor.

18. The electrical circuit according to claim 7, wherein a clamping element or diode is arranged between the conducting portion and the common substrate in order to provide an overload protection.

19. The electrical circuit according to claim 8, wherein one or more adhesive layers are arranged between the lower layer and the upper layer.

20. The electrical circuit according to claim 19, wherein an adhesive layer arranged between the conducting portion and the second substantially planar electrical circuit part is formed as a conducting element having a resistance.

21. The electrical circuit according to claim 20, wherein the conducting portion is coupled to a controller which is configured to disable the first substantially planar electrical circuit part in case of detecting the first and/or the second electrical potential present at the conducting portion, wherein the controller comprises a signal detection element configured to detect a voltage change at the conducting element, the voltage change indicating the presence of the first and/or the second electrical potential.

22. The electrical circuit according to claim 7, wherein the second electrical potential is the electrical potential of the common substrate.

23. The electrical circuit according to claim 21, wherein the controller is integrated into the second substantially planar electrical circuit part.

24. An electrical circuit comprising:

a common substrate or a common circuit board;

a first substantially planar electrical circuit part which is arranged on the common substrate or on the common circuit board as a lower layer and to which a first electrical potential is applicable;

a second substantially planar electrical circuit part to which a second, different electrical potential is applicable and which is galvanically isolated from the first substantially planar electrical circuit part by an insulator, wherein the insulator is arranged between the first and the second substantially planar electrical circuit part and comprises a conducting portion, wherein the second substantially planar electrical circuit part is arranged as an upper layer with respect to the first substantially planar electrical circuit part; and a single terminal which comprises one or more connecting taps and which is laterally arranged next to an area of the first and/or second substantially planar electrical circuit, wherein the second substantially planar electrical circuit part is electrically connected to the terminal via one or more bond wires and wherein the conducting portion is electrically connected to at least one connecting tap of the terminal via a further bond wire;

wherein the first substantially planar electrical circuit part is a conductor of a high voltage section and wherein the second substantially planar electrical circuit part is a circuit element of a low voltage section.

25. A system, comprising:
an electrical circuit which comprises:
  a first substantially planar electrical circuit part to which a first electrical potential is applicable; and
  a second substantially planar electrical circuit part to which a second, different electrical potential is applicable and which is galvanically isolated from the first substantially planar electrical circuit part by an insulator;
  wherein the insulator comprises a conducting portion; and
a controller which is coupled to the conducting portion and configured to disable the first substantially planar electrical circuit part in case of detecting the first and/or the second electrical potential present at the conducting portion;
  wherein the first and the second substantially planar electrical circuit parts and the insulator form a layer stack, in which the insulator is arranged between the first and the second substantially planar electrical circuit part;
  wherein the first substantially planar electrical circuit part is a conductor of a high voltage section; and
  wherein the second substantially planar electrical circuit part is a circuit element of a low voltage section.

26. A method for avoiding an electrical leakage between a first substantially planar electrical circuit part and a second substantially planar electrical circuit part, wherein the first and the second substantially planar electrical circuit parts are galvanically isolated by an insulator comprising a conducting portion, wherein the first and the second substantially planar electrical circuit parts and the insulator form a layer stack, in which the insulator is arranged between the first and the second substantially planar electrical circuit part, the method comprising:
  applying first electrical potential to the first substantially planar electrical circuit part;
  applying a second, different electrical potential to the second substantially planar electrical circuit part; and
  disabling the first substantially planar electrical circuit part in case of detecting the first and/or the second electrical potential present at the conducting portion.

27. The electrical circuit according to claim 1, wherein the high voltage section is configured for 400V and wherein the low voltage section is configured for 15V or less.

* * * * *